(12) United States Patent
Mishima et al.

(10) Patent No.: US 9,171,894 B2
(45) Date of Patent: Oct. 27, 2015

(54) ORGANIC EL ELEMENT, ORGANIC EL PANEL, ORGANIC EL LIGHT-EMITTING APPARATUS AND ORGANIC EL DISPLAY APPARATUS

(75) Inventors: Kosuke Mishima, Kyoto (JP); Satoru Ohuchi, Osaka (JP)

(73) Assignee: JOLED INC., Tokyo (JP)

(*) Notice: Subject to any disclaimer, the term of this patent is extended or adjusted under 35 U.S.C. 154(b) by 0 days.

(21) Appl. No.: 14/131,439

(22) PCT Filed: Sep. 7, 2012

(86) PCT No.: PCT/JP2012/005693
§ 371 (c)(1), (2), (4) Date: Jan. 8, 2014

(87) PCT Pub. No.: WO2013/179361
PCT Pub. Date: Dec. 5, 2013

(65) Prior Publication Data
US 2014/0131692 A1    May 15, 2014

(30) Foreign Application Priority Data
May 31, 2012 (JP) ................................. 2012-124271

(51) Int. Cl.
*H01L 27/32* (2006.01)
*H01L 51/50* (2006.01)
*H01L 51/52* (2006.01)

(52) U.S. Cl.
CPC .......... *H01L 27/326* (2013.01); *H01L 27/3276* (2013.01); *H01L 51/50* (2013.01); *H01L 51/5012* (2013.01); *H01L 51/5088* (2013.01); *H01L 51/5092* (2013.01); *H01L 51/5221* (2013.01); *H01L 27/3279* (2013.01)

(58) Field of Classification Search
CPC .............................. H01L 33/00; H01L 51/50
See application file for complete search history.

(56) References Cited

U.S. PATENT DOCUMENTS

| 5,443,922 | A  | 8/1995 | Nishizaki et al. | |
|---|---|---|---|---|
| 7,245,297 | B2* | 7/2007 | Kimura et al. | 345/214 |

(Continued)

FOREIGN PATENT DOCUMENTS

| JP | 5-163488 | 6/1993 |
|---|---|---|
| JP | 2005-038833 | 2/2005 |

(Continued)

OTHER PUBLICATIONS

International Search Report (ISR) in International Patent Application No. PCT/JP2012/005693, dated Dec. 11, 2012.

(Continued)

*Primary Examiner* — Thao X Le
*Assistant Examiner* — Xia L Cross
(74) *Attorney, Agent, or Firm* — Greenblum & Bernstein, P.L.C.

(57) ABSTRACT

An organic EL element including: pixel electrode on a section of TFT substrate corresponding to pixel region; auxiliary connector on a section of TFT substrate corresponding to auxiliary region; hole injection layer on pixel electrode and auxiliary connector; and light-emitting layer on a section of hole injection layer corresponding to pixel region. The organic EL element additionally includes: electron injection layer on light-emitting layer and a section of hole injection layer corresponding to auxiliary region; and seamless common electrode on electron injection layer. Hole injection layer contains $WO_x$. Electron injection layer contains NaF. Common electrode contains Al that causes the reduction of NaF contained in electron injection layer.

15 Claims, 9 Drawing Sheets

(56) References Cited

U.S. PATENT DOCUMENTS

| | | | |
|---|---|---|---|
| 2005/0012454 | A1 | 1/2005 | Yamazaki et al. |
| 2007/0029929 | A1* | 2/2007 | Nakamura et al. ............ 313/506 |
| 2007/0205718 | A1 | 9/2007 | Yamazaki et al. |
| 2007/0236424 | A1* | 10/2007 | Kimura ........................... 345/76 |
| 2009/0286445 | A1 | 11/2009 | Yamazaki et al. |
| 2010/0084646 | A1 | 4/2010 | Matsusue et al. |
| 2010/0102310 | A1* | 4/2010 | Komatsu et al. ................ 257/43 |
| 2010/0302221 | A1 | 12/2010 | Okumoto |
| 2012/0074397 | A1 | 3/2012 | Okumoto |

FOREIGN PATENT DOCUMENTS

| | | |
|---|---|---|
| JP | 2007-073499 | 3/2007 |
| WO | 2009/110186 | 9/2009 |
| WO | 2010/070798 | 6/2010 |

OTHER PUBLICATIONS

Kaname Kanai et al., "Electronic structure of anode interface with molybdenum oxide buffer layer", Organic Electronics 11, pp. 188-194 (2010).

* cited by examiner

ORGANIC EL ELEMENT, ORGANIC EL PANEL, ORGANIC EL LIGHT-EMITTING APPARATUS AND ORGANIC EL DISPLAY APPARATUS

TECHNICAL FIELD

The present invention relates to the structure of an organic electric field light-emitting element (hereinafter referred to as "organic EL element"), and in particular to technology of improving the conductivity between an auxiliary electrode and a common electrode which are disposed at a distance from a pixel electrode, and to a display panel, light-emitting apparatus and display apparatus having such an organic EL element.

BACKGROUND ART

In recent years, progress is being made in research and development of diverse functional elements which involve the use of an organic semiconductor. One typical example of a functional element is an organic EL element. An organic EL element is a current-driven light-emitting element, and commonly has a pair of electrodes, namely a pixel electrode and a common electrode, and functional layers layered between the pair of electrodes. The functional layers include a light-emitting layer composed of an organic material. Upon application of voltage across the pair of electrodes, holes injected from the pixel electrode to the functional layers recombine with electrons injected from the common electrode to the functional layers. The recombination causes the phenomenon of electroluminescence, which involves emission of light. Given the high visibility of organic EL elements resulting from their self-luminescence, as well as their excellent shock resistance resulting from the fully solid-state structure thereof, more attention is now being given to the application of organic EL elements as a light-emitting element for various organic EL display panels and organic EL display apparatuses or a light source.

Generally, a common electrode of an organic EL display panel is disposed to cover the entire surface of the panel on which organic EL elements are arranged. At the periphery of the panel, the common electrode is connected to a voltage source so that voltage is externally applied to the common electrode. Due to this structure, the central area of the panel is supplied with voltage from the voltage source via an electrical resistance of the common electrode. Therefore, the voltages applied to the light-emitting layer in the central area and in the peripheral area of the panel might vary greatly despite the same voltage supplied from the voltage source, and accordingly the luminance of each organic EL element might differ from each other. To solve this problem, there has been a proposal of the use of, in addition to the common electrode, an auxiliary connector having a lower resistance than the common electrode, and thereby reducing the difference among the voltages applied to the light-emitting layers in the panel (Patent Literature 1).

CITATION LIST

Patent Literature

[Patent Literature 1] Japanese Patent Application Publication No. 2007-73499

Non-Patent Literature

[Non-Patent Literature 1] Kaname Kanai et al., Organic Electronics 11, 188 (2010)

SUMMARY OF INVENTION

Technical Problem

In recent years, display panels having organic EL elements have been getting larger. In a large display panel, the common electrode, which is disposed in the path from the voltage source to the central area of the panel, has a large electrical resistance. Therefore, the voltage applied via the common electrode varies greatly for each of the light-emitting layers in the panel. If the difference among the voltages increases, the uneven luminance of the panel becomes pronounced.

The present invention is made in view of the problem described above, and aims to provide an organic EL element that reduces the difference among the voltages applied to the light-emitting layers in the panel.

Solution to Problem

To achieve the above-described aim, an organic EL element pertaining to one aspect of the present invention is an organic EL element including: a substrate; and a pixel region and an auxiliary region formed adjacent to each other on the substrate, comprising: a pixel electrode formed on a section of the substrate corresponding to the pixel region; an auxiliary connector formed on a section of the substrate corresponding to the auxiliary region; a first functional layer formed to cover the pixel electrode and the auxiliary connector; a light-emitting layer containing organic light-emitting material and formed on a section of the first functional layer corresponding to the pixel region; a second functional layer formed to cover the light-emitting layer and a section of the first functional layer corresponding to the auxiliary region; and a common electrode formed to seamlessly cover a section of the second functional layer corresponding to the pixel region and a section of the second functional layer corresponding to the auxiliary region, wherein the first functional layer contains an oxide compound of a transition metal, the second functional layer contains a fluoride compound of at least one of an alkali metal and an alkaline-earth metal, and the common electrode contains a metal that causes reduction of the fluoride compound contained in the second functional layer.

Advantageous Effects of Invention

In the organic EL element pertaining to one aspect of the present invention, the first functional layer contains an oxide compound of a transition metal, the second functional layer contains a fluoride compound of at least one of an alkali metal and an alkaline-earth metal, and the common electrode contains a metal that causes the reduction of the fluoride compound contained in the second functional layer. Therefore, the difference among the voltages applied to the light-emitting layers in the panel can be reduced.

BRIEF DESCRIPTION OF DRAWINGS

FIGS. 4A through 4C are cross-sectional views showing a method of manufacturing the organic EL display panel depicted in FIG. 1, and specifically.

FIGS. 5A and 5B are cross-sectional views showing a method of manufacturing the organic EL display panel depicted in FIG. 1, and specifically.

DESCRIPTION OF EMBODIMENTS

Background Leading to Embodiments of Invention

Before providing a specific description of an embodiment of the present invention, the following explains the background leading to the embodiment of the present invention.

As described above, the demand for reducing the difference among the voltages applied to the light-emitting layers in the panel is further increasing with the recent increase in size of display panels having organic EL elements. The inventors of the present invention made an attempt to meet the demand by improving the conductivity between the auxiliary connector and the common electrode.

Generally, in a panel having a substrate on which pixel regions with pixel electrodes and auxiliary regions with connectors are provided adjacent to each other, functional layers for improving the hole injection properties and the electron injection properties are disposed at least on the sections of the substrate corresponding to the pixel regions. Some of the functional layers formed by a wet process such as an inkjet method are formed only on the sections corresponding to the pixel regions. On the other hand, other functional layers formed by a sputtering method or a vacuum deposition method are usually formed over the entire surface of the panel, and therefore they are usually formed on the sections corresponding to the auxiliary regions as well. Considering this, the inventors conceived of improving the conductivity between the auxiliary connectors and the common electrodes by improving the conductivity of sections of the functional layers that correspond to the auxiliary regions.

Here, the functional layers may contain transition metal oxides that could have different oxidation numbers. The inventors conceived of forming the functional layers containing a transition metal oxide that has a high conductivity when its oxidation number is small so that the sections of the functional layers corresponding to the auxiliary regions contain a transition metal oxide having a small oxidation number. Consequently, the inventors found that such a structure actually improves the conductivity of the sections of the functional layers corresponding to the auxiliary regions and improves the conductivity between the auxiliary connectors and the common electrodes, and concluded that this structure leads to further reduction of the difference among the voltages applied to the light-emitting layers in the panel. The background leading to the present embodiment is as described above.

In the following, description is provided on an organic EL element pertaining to the embodiment of the present invention. Subsequently, results and observations will be presented for each of the experiments performed to assess the efficiency of the present invention. Note that each figure is illustrated on a reduced scale different from the proportion of the actual sizes.

Outline of Embodiment

An organic EL element pertaining to one aspect of the present invention is an organic EL element including: a substrate; and a pixel region and an auxiliary region formed adjacent to each other on the substrate, comprising: a pixel electrode formed on a section of the substrate corresponding to the pixel region; an auxiliary connector formed on a section of the substrate corresponding to the auxiliary region; a first functional layer formed to cover the pixel electrode and the auxiliary connector; a light-emitting layer containing organic light-emitting material and formed on a section of the first functional layer corresponding to the pixel region; a second functional layer formed to cover the light-emitting layer and a section of the first functional layer corresponding to the auxiliary region; and a common electrode formed to seamlessly cover a section of the second functional layer corresponding to the pixel region and a section of the second functional layer corresponding to the auxiliary region, wherein the first functional layer contains an oxide compound of a transition metal, the second functional layer contains a fluoride compound of at least one of an alkali metal and an alkaline-earth metal, and the common electrode contains a metal that causes reduction of the fluoride compound contained in the second functional layer.

Therefore, the present invention provides an organic EL element with a reduced difference among the voltages applied to the light-emitting layers in the panel.

A maximum thickness of the section of the second functional layer corresponding to the auxiliary region may be equal to or smaller than a maximum peak-to-valley height Rmax in a roughness profile of a surface of the section of the first functional layer corresponding to the auxiliary region.

At least a peak of the surface of the section of the first functional layer corresponding to the auxiliary region may be in contact with the common electrode.

An XPS spectrum of the section of the first functional layer corresponding to the auxiliary region may exhibit a greater upward protrusion than an XPS spectrum of the section of the first functional layer corresponding to the pixel region within a range between a lowest binding energy level corresponding to respective peaks of the XPS spectra and a binding energy level that is 3.6 eV lower than the lowest binding energy level.

An average oxidation number of the transition metal contained in the section of the first functional layer corresponding to the auxiliary region may be smaller than an average oxidation number of the transition metal contained in the section of the first functional layer corresponding to the pixel region.

The transition metal may be W, Mo, or V.

The fluoride compound contained in the second functional layer may be NaF, $BaF_2$, $CaF_2$, CsF, or $MgF_2$.

The metal that causes the reduction may be Al, Cu, Ag, or Mg.

Another aspect of the present invention is an organic EL panel having the organic EL element provided in a plurality.

Yet another aspect of the present invention is an organic EL light-emitting apparatus having the organic EL element and a drive circuit for driving the organic EL element.

Yet another aspect of the present invention is an organic EL display apparatus having the organic EL element and a drive circuit for driving the organic EL element.

EMBODIMENTS

Embodiment 1

1. Overall Structure

Figure 1:
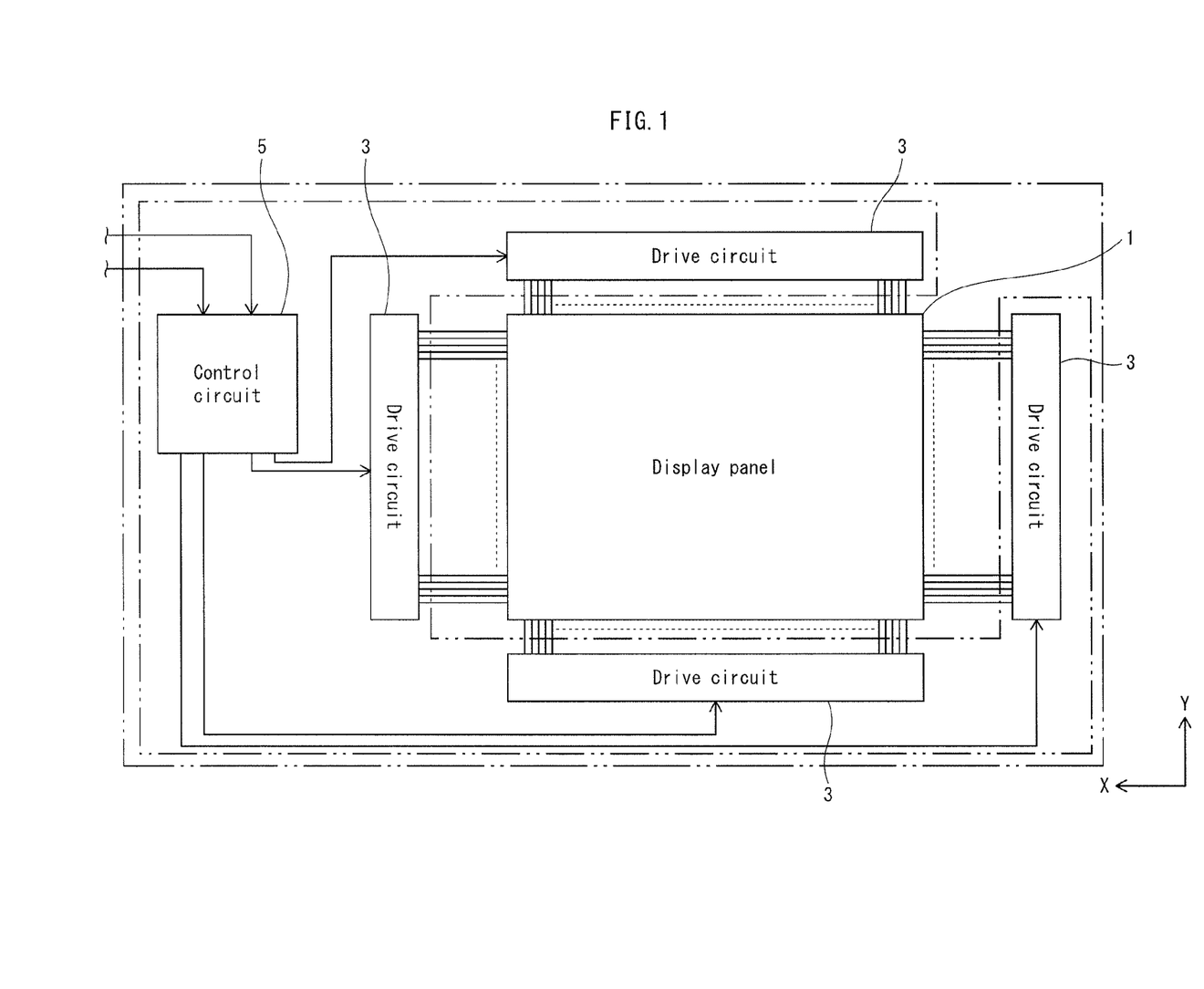
FIG. 1 is a schematic block diagram showing an overall structure of an organic EL display panel pertaining to Embodiment.

The following describes an embodiment of the present invention in detail, with reference to the drawings. FIG. 1 is a schematic block diagram showing an overall structure of a light-emitting apparatus having an organic EL display panel 1 pertaining to Embodiment 1 of the present invention. Note that the organic EL display panel 1 is a top-emission type display panel that emits the light generated by the light-emitting layer from the side that is opposite the glass substrate. Specifically, the common electrode made of aluminum (Al), which is provided in the organic EL display panel 1, has an extremely small thickness and is hence light-transmissive. The organic EL display panel 1 is an application type display panel in which the organic functional layer is, for example, applied by a wet process.

As shown in FIG. 1, the organic EL display panel 1 is connected to a drive circuit 3, and the drive circuit 3 is under the control of a control circuit 5. The organic EL display panel 1 is a light-emitting apparatus that uses the phenomenon of electroluminescence occurring in organic material and is composed of an array of a plurality of organic EL elements. In an actual light-emitting apparatus, the arrangement of the drive circuit 3 and the control circuit 5 is not limited in this way.

Figure 2:
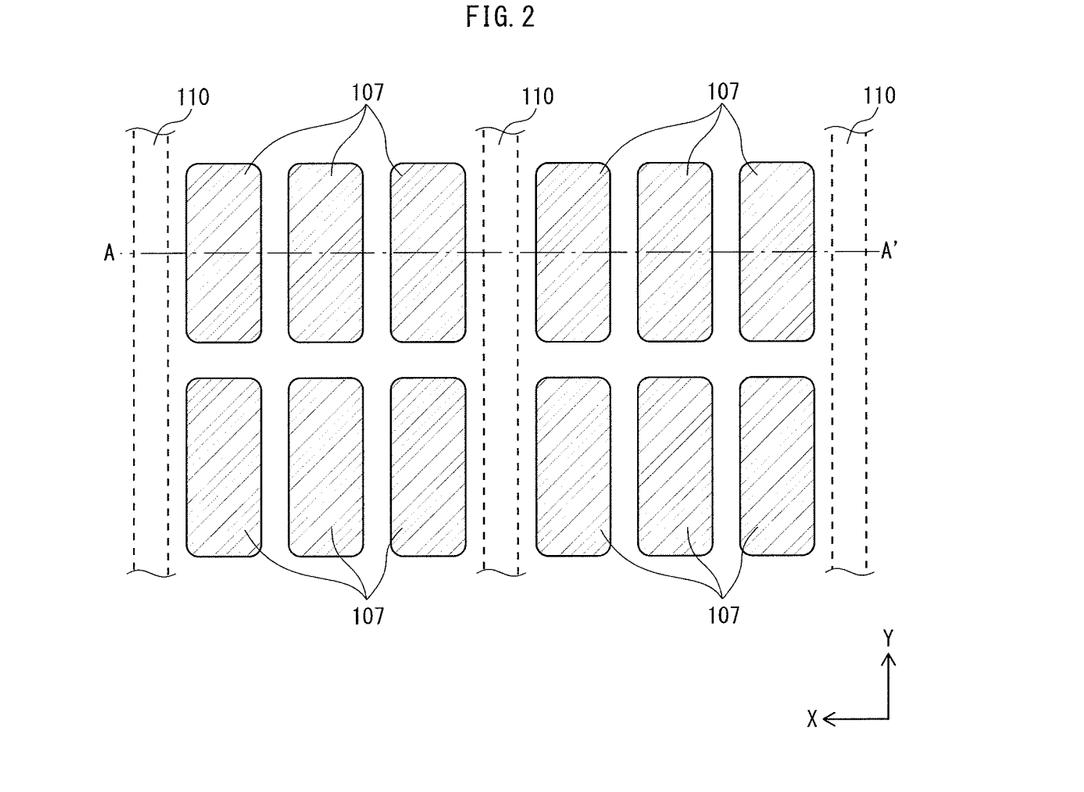
FIG. 2 is a top view of the organic EL display panel depicted in FIG. 1, showing the arrangement of light-emitting layers and auxiliary connectors.

FIG. 2A is a top view of the organic EL display panel 1 depicted in FIG. 1, showing the arrangement of the light-emitting layers and the auxiliary connectors. Light-emitting layers 107, each formed in a rectangular shape having the same area, are arranged in a matrix. Auxiliary connectors 110 are formed to extend in the column direction (i.e. Y direction), and are arranged to sandwich three light-emitting layers 107 aligned in the raw direction (i.e. X direction).

Figure 3:
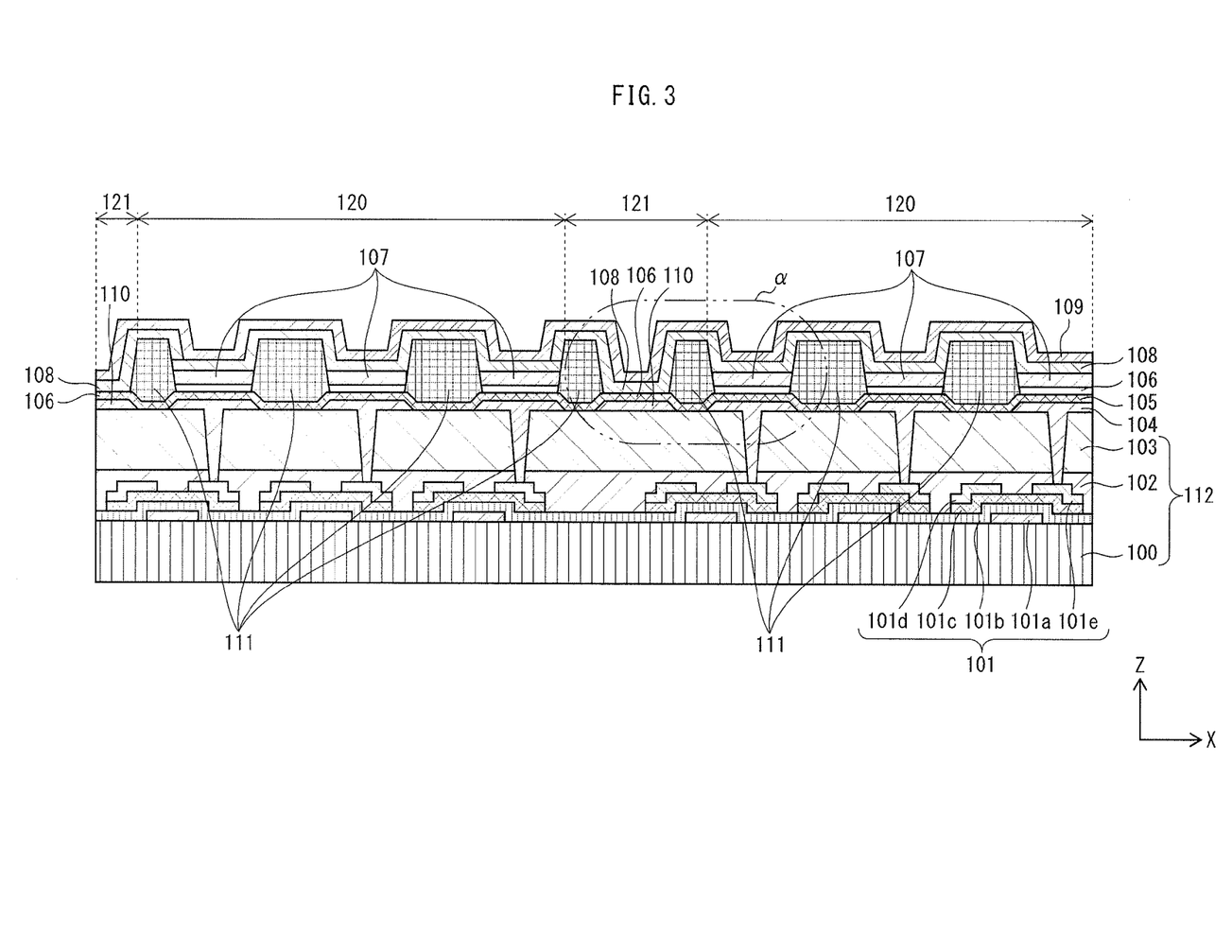
FIG. 3 is a cross-sectional view of the organic EL display panel depicted in FIG. 1.

FIG. 3 is a cross-sectional view of the organic EL display panel 1 depicted in FIG. 1. FIG. 3 corresponds to the cross section along the A-A' line shown in FIG. 2.

The organic EL display panel 1 includes a TFT substrate 112 that includes: a glass substrate 100, a thin film transistor (TFT) layer 101, an interlayer insulation layer 102 and a planarizing layer 103. The TFT layer 101 is composed of electrodes 101a, 101b and 101c, a source electrode 101d, and a drain electrode 101e. On the TFT substrate 112 included in the organic EL display panel 1, a pixel region 120 and an auxiliary region 121 are provided adjacent to each other in the horizontal direction (i.e. X direction). In the following description, the expression "the sections corresponding to the pixel regions 120" of each layer means the sections of each layer provided above the pixel regions 120 of the TFT substrate 112. Similarly, the expression "the sections corresponding to the auxiliary regions 121" means the sections of each layer provided above the auxiliary regions 121 of the TFT substrate 112.

The organic EL display panel 1 also includes: a pixel electrode 104 provided on each of the sections of the TFT substrate 112 corresponding to the pixel regions 120; an auxiliary connector 110 provided on each of the sections of the TFT substrate 112 corresponding to the auxiliary regions 121; and partition layers 111 provided between each adjacent pair of the pixel electrodes 104 and between each adjacent pair of the pixel electrode 104 and the auxiliary connector 110. The pixel electrodes 104 are formed above the TFT layer 101 on the TFT substrate 112. Each partition layer 111 tapers in this cross section. Furthermore, the organic EL display panel 1 includes: a hole injection layer 105 serving as a first functional layer seamlessly formed on the pixel electrodes 104 and the auxiliary connectors 110; a hole transport layer 106 formed on the sections of the hole injection layer 105 corresponding to the pixel regions 120; a light-emitting layer 107 formed on the hole transport layer 106; an electron injection layer 108 serving as a second functional layer formed on the light-emitting layer 107 and on the sections of the hole injection layer 105 corresponding to the auxiliary regions 121; and a common electrode 109 seamlessly formed on the electron injection layer 108. The hole injection layer 105 may be seamless on the pixel electrodes 104 and auxiliary connectors 110, or may be step-like depending on the thickness of hole injection layer 105 or the method of manufacturing. The pixel electrode 104, the common electrode 109, and the auxiliary connector 110 are connected to a DC power supply via the drive circuit 3 shown in FIG. 1, and voltage is applied to them from outside the organic EL display panel 1. The organic EL display panel 1 is thus supplied with power.

2. Material of Each Layer

The glass substrate 100 is made of alkali-free glass. Alternatively, the substrate 100 may be formed with one of insulating materials, such as soda glass, nonfluorescent glass, phosphate glass, borate glass, quartz, acrylic resin, styrenic resin, polycarbonate resin, epoxy resin, polyethylene, polyester, silicone resin, and alumina.

The pixel electrode 104 is composed of layers of aluminum alloy and indium tin oxide (ITO). The material of the pixel electrode 104 is not limited to the above, and silver alloy, IZO or ZnO may be used, for example.

The hole injection layer 105 is made of $WO_x$ (tungsten oxide).

The hole transport layer 106 is made of TFB (poly(9,9-di-n-octylfluorene-alt-(1,4-phenylene-((4-sec-butylphenyl) imino)-1,4-phenylene)), which is an amine-based compound.

The light-emitting layer 107 is made of F8BT (poly(9,9-di-n-octylfluorene-alt-benzothiadiazole)), which is an organic polymer. The material of the light-emitting layer 107 is not limited to the above, and any known organic material may be used. The organic light-emitting layer 107 is made of, for example, a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

The electron injection layer 108 is made of NaF (sodium fluoride).

The common electrode 109 is made of Al.

The auxiliary connector 110 is composed of layers of aluminum alloy and indium tin oxide (ITO) as with the pixel electrode 104.

3. Method of Manufacturing Organic EL Display Panel 1

Next, a description is given of a method of manufacturing the organic EL display panel 1.

FIGS. 4A through 4C and 5A and B are cross-sectional views for illustrating a method of manufacturing the organic EL display panel 1 depicted in FIG. 1.

Figure 4A:
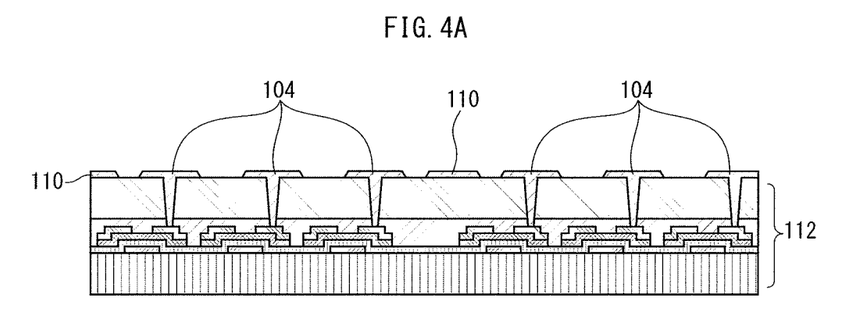
FIG. 4A shows a step of forming pixel electrodes and auxiliary connectors.

First, as shown in FIG. 4A, the pixel electrodes 104 and the auxiliary connectors 110, each made of aluminum alloy and ITO, are formed on the TFT substrate 112. Specifically, first the TFT substrate 112 is placed inside the chamber of a sputtering film-forming apparatus. Subsequently, by performing sputtering on the target material while injecting a reactive gas into the chamber, films of aluminum and ITO are formed on the TFT substrate 112. Furthermore, a photoresist film is applied to the upper surface of the ITO films, and a mask pattern is formed by performing a pattern exposure, development, and firing on the photoresist film. The shapes defined by the mask pattern correspond to the shapes of the pixel electrodes 104 and the auxiliary connectors 110. Subsequently, etching using etchant is performed on the ITO films on which the mask pattern has been formed. By the steps described above, the pixel electrodes 104 and the auxiliary connectors 110, each composed of layers of aluminum alloy and indium tin oxide (ITO), are formed on the TFT substrate 112.

Figure 4B:
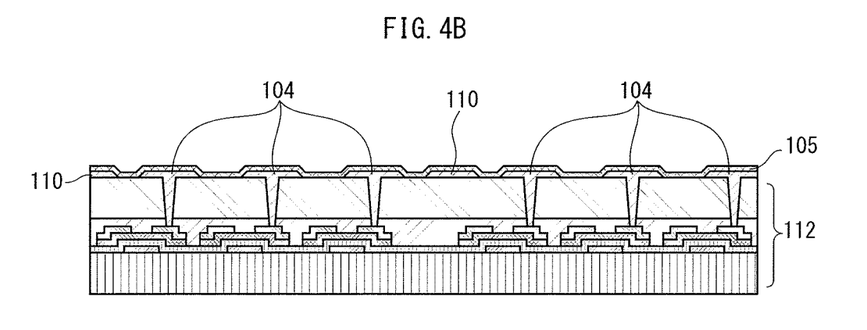
FIG. 4B shows a step of forming a hole injection layer.

Next, as shown in FIG. 4B, the hole injection layer 105 containing $WO_x$ is formed continuously on the pixel electrodes 104 and the auxiliary connectors 110. Since a metal film of $WO_x$ or the like is formed on the hole injection layer 105, the hole injection layer 105 is formed by a sputtering method. Specifically, in a chamber into which an argon gas and an oxygen gas have been introduced, argon is ionized by the application of high voltage, and the argon ions are caused to bombard the target. Due to the bombardment of the target with the argon ions, W atoms are released from the target and react with the oxygen gas to form $WO_x$. Consequently, the hole injection layer 105 made of $WO_x$ is formed all over the pixel electrodes 104 and the auxiliary connectors 110. The hole injection layer 105 is a thin film having a thickness of 1 nm to 50 nm, and the maximum peak-to-valley height Rmax in the roughness profile of the surface of the hole injection layer 105 is approximately 1 nm to 15 nm.

Figure 4C:
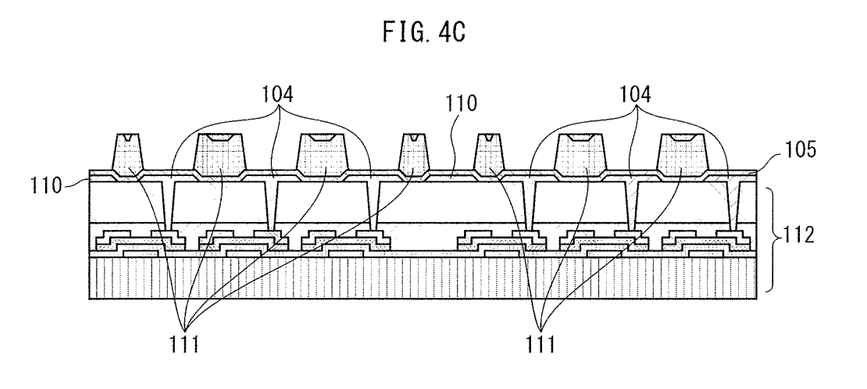
FIG. 4C shows a step of forming partition layers.

Furthermore, as shown in FIG. 4C, the partition layers 111 are formed between each adjacent pair of the pixel electrodes 104 and each adjacent pair of the pixel electrode 104 and the auxiliary connector 110. Specifically, first, a layer serving as the material of the partition layers 111 is formed to cover the hole injection layer 105 by, for example, a spin coat method. Next, a mask is formed on the layer serving as material of the partition layers 111. The mask has openings at the positions where the partition layers 111 are to be formed. Under this condition, the patterning is performed by photolithography, so that the partition layers 111 are formed between each adjacent pair of the pixel electrodes 104 and each adjacent pair of the pixel electrode 104 and the auxiliary connector 110.

Figure 5A:
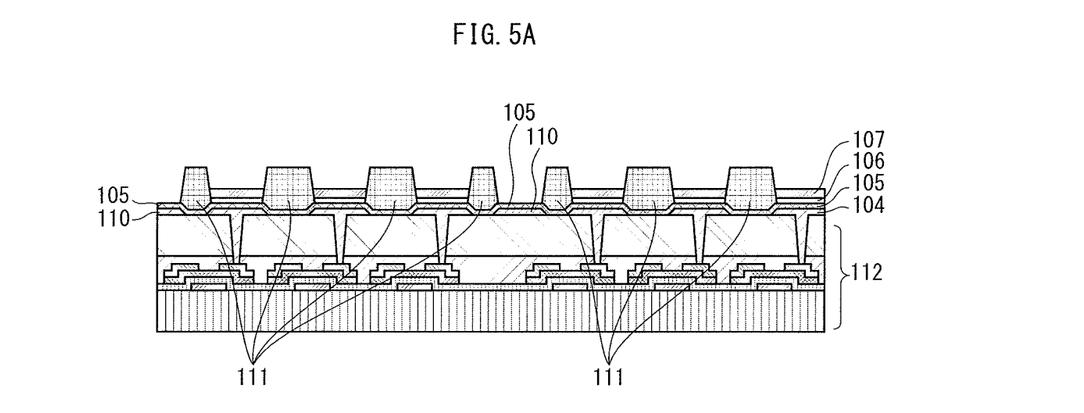
FIG. 5A shows a step of forming a hole transport layer and a light-emitting layer.

Next, as shown in FIG. 5A, the hole transport layer 106 and the light-emitting layer 107 are sequentially formed on the sections of the hole injection layer 105 corresponding to the pixel regions 120. Specifically, drops of ink containing organic material and solvent are dripped onto the surface of the sections of the hole injection layer 105 corresponding to the pixel regions 120 by a wet process such as an inkjet method and the solvent is removed by volatilization. Thus, the hole transport layer 106 and the light-emitting layer 107 are sequentially formed on the sections of the hole injection layer 105 corresponding to the pixel regions 120. Note that the method used for forming the hole transporting layer 106 and the light-emitting layer 107 is not limited to an inkjet method. Ink may be ejected/applied by another commonly-known method such as spin coating, a gravure printing method, a dispenser method, a nozzle coating method, a intaglio printing method, or a relief printing method.

Figure 5B:
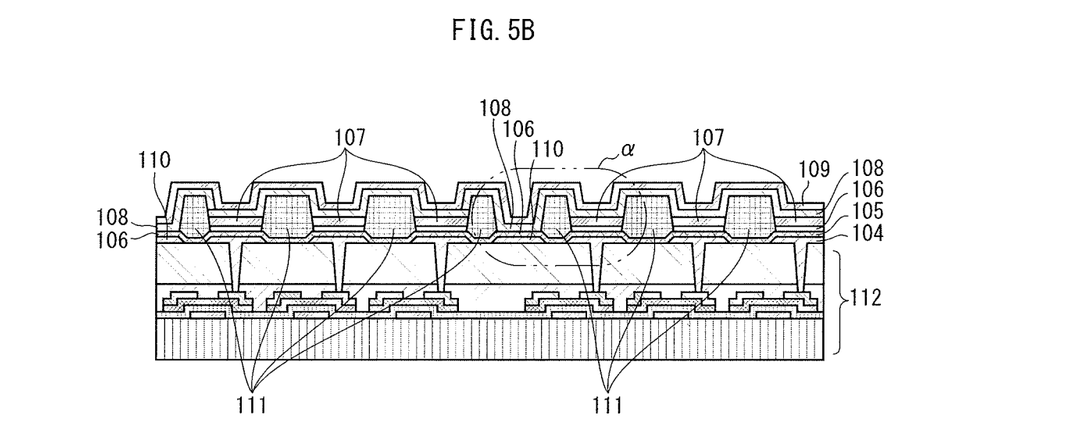
FIG. 5B shows a step of forming an electron injection layer and a hole injection layer.

Finally, as shown in FIG. 5B, the electron injection layer 108 and the common electrode 109 are sequentially formed on the upper surface of the light-emitting layer 107 and the sections of the hole injection layer 105 corresponding to the auxiliary regions 121. Since metal films of NaF or Al are formed on the electron injection layer 108 and the common electrode 109, the electron injection layer 108 and the common electrode 109 are formed by a vacuum deposition method.

Note that although not illustrated in FIG. 3, a passivation layer may be additionally formed on the common electrode 109 in order as to protect the electrode pairs and the functional layers from being exposed to the atmosphere after the completion of the organic EL display panel 1. Specifically, a passivation layer made of for example SiN (silicon nitride) or SiON (silicon oxynitride) may be disposed such that inside the organic EL display panel 1 is sealed. Instead of the passivation layer, a sealing cap may be provided to isolate the entire organic EL display panel 1 from external space. Specifically, a sealing cap may be formed by using, for instance, the same material as the glass substrate 100, and a getter which absorbs moisture and the like may be provided within the sealed space.

Performance of the above steps completes the organic EL display panel 1.

4. Conductivity Between Auxiliary Connector 110 and Common Electrode 109

In the following, a description is first given to the structure of the layers formed on the auxiliary connectors 110 and the pixel electrodes 104, and then a description is given to the mechanism of improving conductivity between each pair of the auxiliary connector 110 and the electrode 109.

4-1. Structure of Layers Formed on Auxiliary Connectors 110 and Pixel Electrodes 104

Figure 6A:
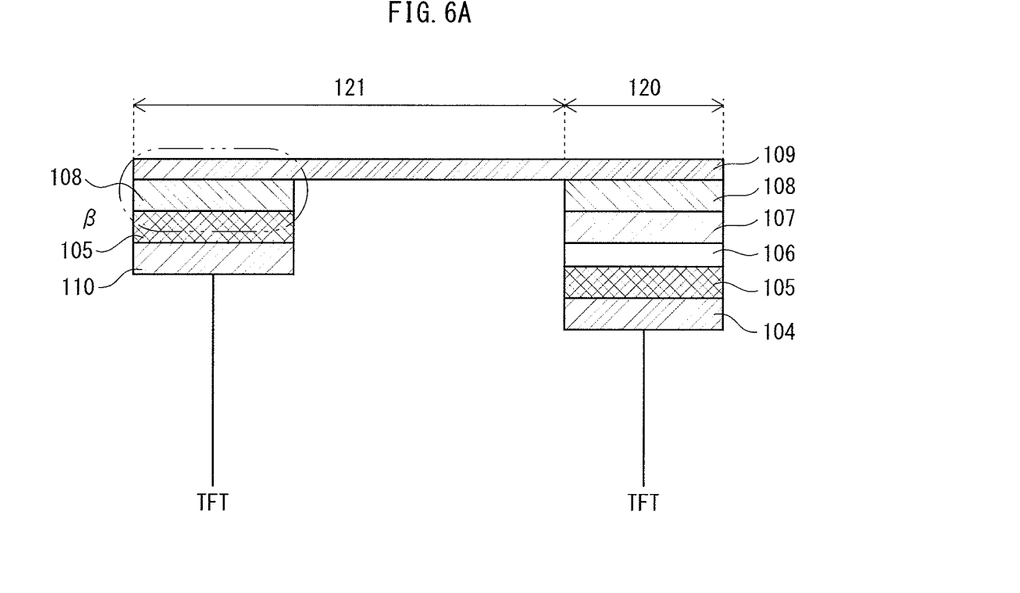
FIG. 6A is a schematic cross-sectional view of the organic EL display panel depicted in FIG. 1.
Figure 6B:
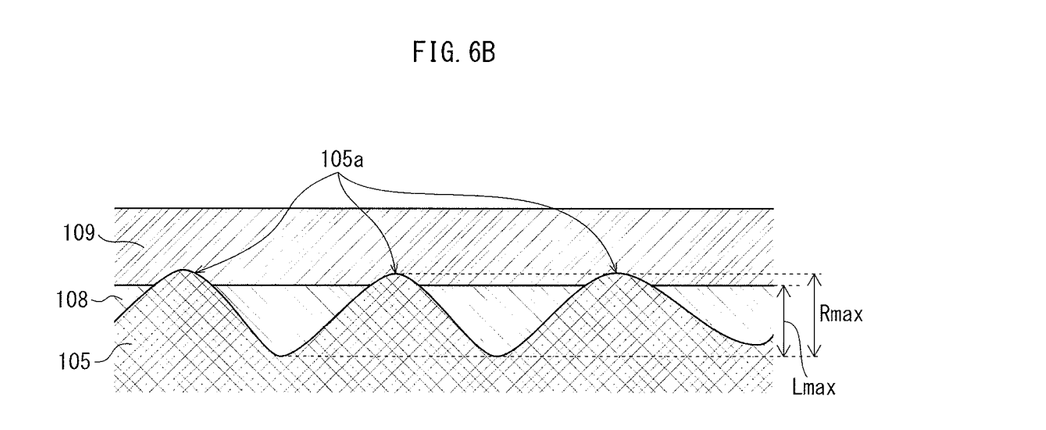
FIG. 6B is a partially-enlarged view of the cross-sectional view depicted in FIG. 6A.

FIG. 6A is a schematic cross-sectional view of the organic EL display panel 1 depicted in FIG. 1. FIG. 6B is an enlarged view of an area of the auxiliary connector 110, namely area β surrounded by the dotted line depicted in the cross-sectional view shown in FIG. 6A.

As shown in FIG. 6A, on the pixel electrode 104, the hole injection layer 105, the hole transport layer 106, the light-emitting layer 107, and the electron injection layer 108, and the common electrode 109 are formed. On the other hand, on the auxiliary connector 110, the hole injection layer 105, the electron injection layer 108, and the common electrode 109 are formed.

As shown in FIG. 6B, the surface of the hole injection layer 105 on the auxiliary connector 110 is rough. This is because, as described above, the hole injection layer 105 is a thin film having a thickness of 1 nm to 50 nm. The maximum value Lmax of the thickness of the electron injection layer 108 is equal to or smaller than the maximum peak-to-valley height Rmax in the roughness profile of the surface the hole injection layer 105. Here, the thickness of the electron injection layer 108 ranges from 0.5 nm to 10 nm. If the surface of the hole injection layer 105 serving as the base layer is rough, the thickness of the electron injection layer 108 will not be uniform even if the electron injection layer 108 is formed by a vacuum deposition method. In this structure, the smallest thickness of the electron injection layer 108 is 0. Therefore, portions of the electron injection layer 108 are embedded in valleys of the hole injection layer 105, and some of the peaks of the hole injection layer 105 are in contact with the common electrode 109.

4-2. Conductivity Between Auxiliary Connector 110 and Common Electrode 109

Figure 7A:
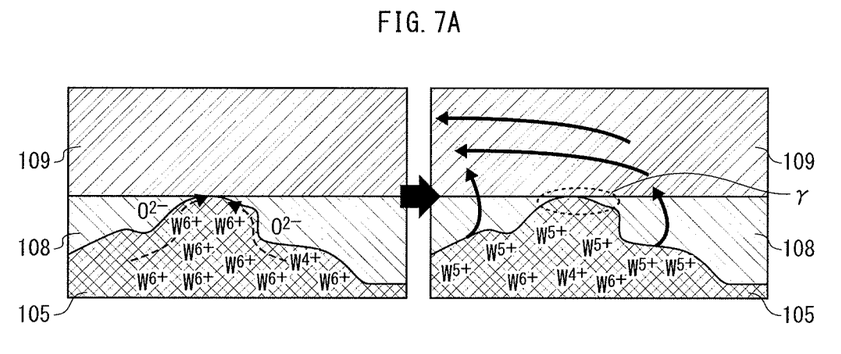
FIG. 7A illustrates the structure of the layers disposed on an auxiliary connector of the organic EL display panel depicted in FIG. 1.
Figure 7B:
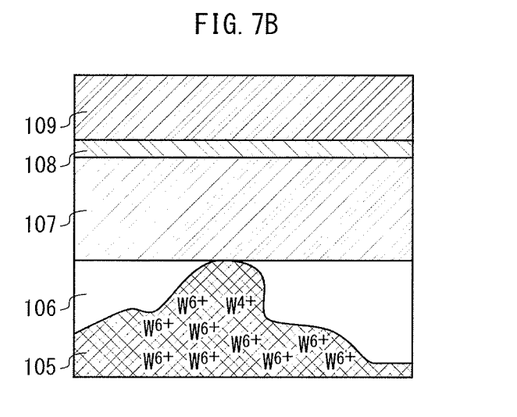
FIG. 7B illustrates the structure of the layers disposed on a pixel electrode of the organic EL display panel depicted in FIG. 1.

FIG. 7A illustrates the structure of the layers disposed on the auxiliary connector 110 of the organic EL display panel 1 depicted in FIG. 1. The left part corresponds to a time point immediately after the formation of the common electrode 109, and the right part corresponds to a time point a given time after the formation of the common electrode 109. FIG. 7B illustrates the structure of the layers disposed on the pixel electrode 104 of the organic EL display panel 1 depicted in FIG. 1.

As shown in the left part of FIG. 7A, on the auxiliary connector 110, the hole injection layer 105 made of $WO_x$ contains W with an oxidation number of +6 (hereinafter referred to as $W^{6+}$), W with an oxidation number of +5 (hereinafter referred to as $W^{5+}$) and W with an oxidation number of +4 (hereinafter referred to as $W^{4+}$). Note that the oxidation number of W can be +6, +5, +4, +3, and so on.

A given time after the formation of the common electrode 109, as shown in the right part of FIG. 7A, $W^{6+}$ in the area γ of the hole injection layer 105 where the hole injection layer 105 is in contact with the common electrode 109 is reduced to $W^{5+}$. This is because aluminum contained in the common electrode 109 causes a reduction reaction. Even when the common electrode 109 is not in contact with the hole injection layer 105, aluminum contained in the common electrode 109 could cause the reduction of $W^{6+}$ contained in the hole injection layer 105 if the electron injection layer 108 is thin enough. The expression "thin enough" means that the electron injection layer 108 has a thickness of 0.1 nm to 1 nm, for example.

Here, the maximum possible oxidation number of W in $WO_x$ is +6. Therefore, it can be said that $WO_x$ containing $W^{5+}$ has a structure similar to an oxygen vacancy. It has been reported that forming a structure similar to an oxygen vacancy improves the hole conduction efficiency of the hole injection layer due to an electron level that is based on the structure (Non-Patent Literature 1). According to this report, it can be considered that $W^{5+}$ has a higher conductivity than $W^{6+}$.

When Al contained in the common electrode 109 causes the reduction of $W^{6+}$, $O^{2-}$ is generated from $WO_x$, and $O^{2-}$ and for example $Al^{3+}$ form $AlO_x$ (aluminum oxide). However, it is unlikely that $AlO_x$ is formed in the entire area near the area γ. The following explains about it.

Al contained in the common electrode 109 has the effect of reducing not only $W^{6+}$ contained in the hole injection layer, but also $Na^+$ contained in NaF in the electron injection layer 108 to Na. Al contained in the common electrode 109 causes the reduction of $Na^+$, no $O^{2-}$ is generated, and therefore $AlO_x$ is not formed. Consequently, $AlO_x$ having a lower conductivity than Al is formed only in part of the area around the area γ. The electric current from the auxiliary connector 110 via $W^{5+}$ in the hole injection layer 105 can flow to Al in the common electrode 109.

Considering the above, it can be said that the conductivity between the common electrode 109 and the hole injection layer 105 is improved on the auxiliary connector 110.

4-3. Conductivity Between Pixel Electrode 104 and Common Electrode 109

On the auxiliary connector 110, the conductivity between the common electrode 109 and the hole injection layer 105 is desired to be improved. On the other hand, the hole injection layer 105 on the pixel electrode 104 is desired to have the effect of injecting holes from the pixel electrode 104 in an appropriate balance with the electrons from the common electrode 109, and the effect of blocking, among the electrons from the common electrode 109, the electrons flowing from the light-emitting layer to the hole injection layer 105 so that the electrons remain within the light-emitting layer. As shown in FIG. 7B, on the pixel electrode 104, the hole transport layer 106, the light-emitting layer 107, and the electron injection layer 108 are disposed between the common electrode 109 and the hole injection layer 105. Therefore, the aluminum contained in the common electrode 109 does not cause the reduction of W in the hole injection layer 105. As described above, an appropriate balance between the holes injection properties and the electron blocking properties necessary for the luminescence property is realized, and the luminescence properties of the light-emitting layer 107 can be improved.

5. Effects 5-1. Measurement of Resistance Between Auxiliary Connector 110 and Common Electrode 109

Figure 8:
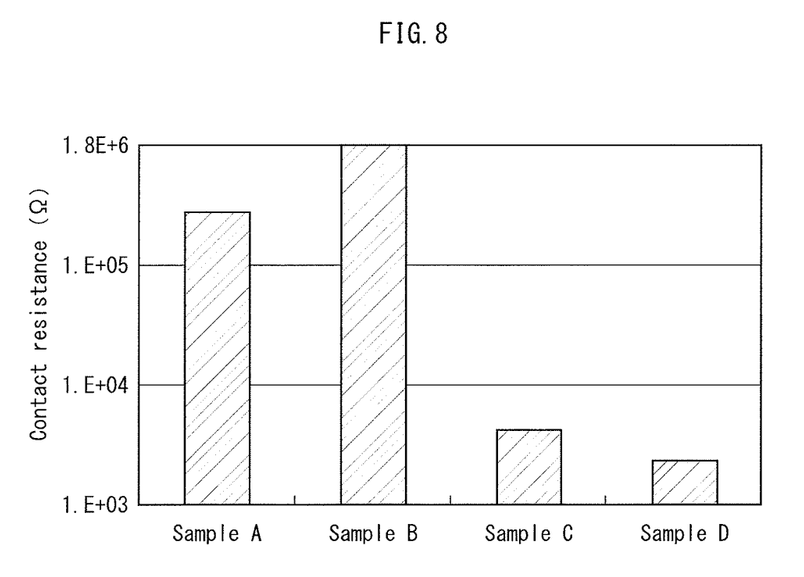
FIG. 8 shows the binding energy of the hole injection layer on an auxiliary connector and on a pixel electrode of the organic EL display panel depicted in FIG. 1, measured by XPS.

To confirm the effects of the present embodiment, measurement of the resistance between the auxiliary connector 110 and the common electrode 109 was conducted, and the conductivity between the auxiliary connector 110 and the common electrode 109 was examined. FIG. 8 shows the results of the measurements of the resistance on the auxiliary connector with different structures, thereby illustrating the effects of the organic EL display panel 1 depicted in FIG. 1. Sample A has a structure in which a $WO_x$ layer serving as the first functional layer, an organic electron injection layer material doped with alkaline-earth metal, and a common electrode made of ITO are layered on the auxiliary connector. Sample B has a structure in which a WOx layer serving as the first functional layer, a functional layer containing NaF, an organic electron injection layer material doped with alkaline-earth metal, and a common electrode made of ITO are layered on the auxiliary connector. Sample C has a structure in which an electrode made of $WO_x$ serving as the first functional layer and a common electrode made of aluminum are layered on the auxiliary connector. Sample D has a structure in which an electrode made of $WO_x$ serving as the first functional layer, a functional layer containing NaF, and a common electrode made of aluminum are layered on the auxiliary connector. This sample is equivalent to the present embodiment.

As shown in FIG. 8, the contact resistances of Samples A, B, C and D are respectively 2.74 E+5Ω, 1.80 E+6Ω, 4.22 E+3Ω, and 2.34 E+3Ω. Therefore, it can be said that the conductivity of Sample D, namely the present embodiment, is the highest.

5-2. XPS Measurement

Furthermore, X-ray photoelectron spectroscopy (XPS) was conducted to measure the oxidation number of $WO_x$ contained in the hole-injection layer 105 on the auxiliary connector 110 and the pixel electrode 104.

(XPS Measurement Conditions)

Device used: PHI 5000 VersaProbe X-ray Photoelectron Spectroscopy Device (manufactured by ULVAC-PHI, Inc.)

Light source: Al—K α line

Photoelectron emission angle: 45 degrees with respect to the direction of the normal line to the substrate Interval between measurement points: 0.1 eV Note that the analysis of the peaks was conducted by using software for photoelectron spectroscopy analysis called "PHI Multipak".

Figure 9:
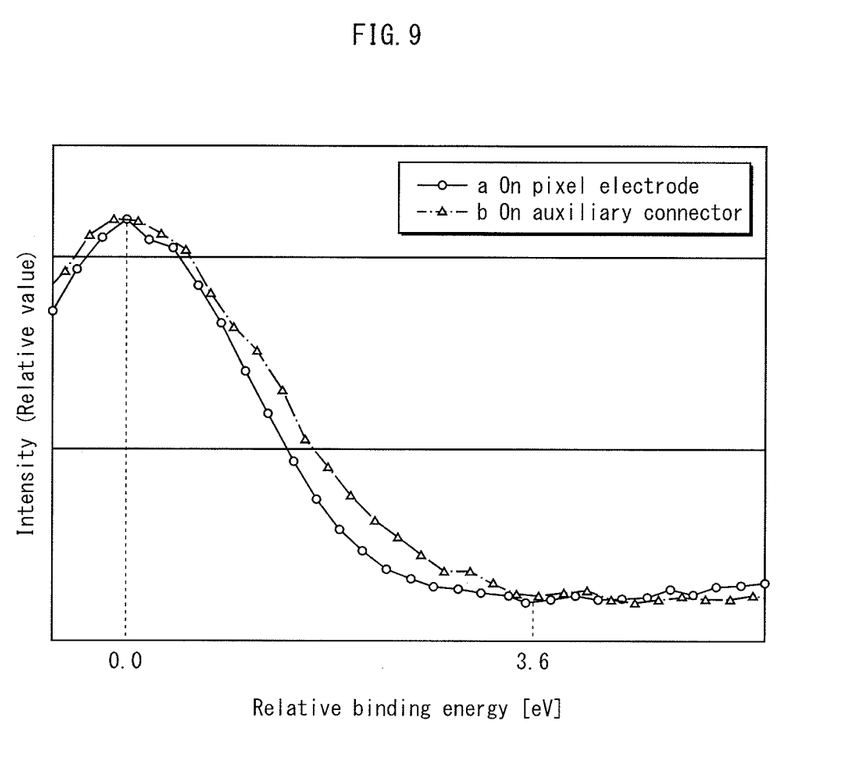
FIG. 9 illustrates advantageous effects of the organic EL display panel depicted in FIG. 1.

FIG. 9 shows the binding energy of the hole injection layer 105 on the auxiliary connector 110 and on the pixel electrode 104 of the organic EL display panel 1 depicted in FIG. 1, measured by XPS. The horizontal axis of FIG. 9 indicates a relative binding energy (ev), and the binding energy decreases from left to right of the drawing sheet. The vertical axis of FIG. 9 indicates a relative intensity. In FIG. 9, graph a corresponds to the hole injection layer 105 on the pixel electrode 104, and graph b corresponds to the hole injection layer 105 on the auxiliary connector 110.

As shown in FIG. 9, the XPS spectrum of the section of the hole injection layer 105 corresponding to the auxiliary region 121 exhibits a greater upward protrusion than the XPS spectrum of the section of the hole injection layer 105 corresponding to the pixel region 120 within the range between the lowest binding energy level corresponding to the respective peaks of the XPS spectra and a binding energy level that is 3.6 eV lower than the lowest binding energy level. This proves that the conductivity of the hole injection layer 105 is different on the auxiliary connector 110 and on the pixel electrode 104. It can be concluded that the organic EL element achieves a desirable conductivity because the section of the hole injection layer 105 corresponding to the pixel region 120 is made of $WO_x$ that exhibits an upward protrusion (not necessarily a peak) within the range between the lowest binding energy level corresponding to the peak and a binding energy level that is approximately 3.6 eV lower than the lowest binding energy level.

5-3. Effects

As described above, the section of the hole injection layer 105 located on the auxiliary connector 110 has a higher conductivity than the section of the hole injection layer 105 located on the pixel electrode 104. Specifically, the tungsten oxides ($WO_x$) in the hole injection layer 105 include W atoms having several oxidation numbers, such as the maximum oxidation number (+6) or a smaller oxidation number (+5, +4, etc.) than the maximum oxidation number. In terms of the entire hole injection layer 105, however, the average of these oxidation numbers can be regarded as the oxidation number of W in the hole injection layer 105. The average of the oxidation numbers of W atoms contained in the sections of the hole injection layer 105 corresponding to the auxiliary regions 121 is smaller than the average of the oxidation number of W atoms contained in the sections of the hole injection layer 105 corresponding to the pixel regions 120. Therefore, the organic EL element having the stated structure can further reduce the difference among the voltages applied to each of the light-emitting layers 107 in the panel. As a result, the stated structure more effectively prevents uneven luminance of the panel.

[Modifications]

The structure of an organic EL element according to an aspect of the present invention is not limited to the structure described above as for the embodiment. The following specifically describes modifications.

1 Structure of Layers Constituting Organic EL Element

An organic EL element according to an aspect of the present invention is not limited to a top emission type element, and may be a bottom emission type element.

In the embodiment described above, a hole transport layer and a light-emitting layer are disposed between the hole injection layer and the electron injection layer. However, the hole transporting layer may be omitted if the combination of layers between the anode and the light-emitting layer can realize smooth injection of the holes from the anode to the light-emitting layer. That is, it is possible that only the light-emitting layer is disposed between the hole injection layer and the electron injection layer.

2. Materials of Auxiliary Connectors, Electron Injection Layer and Common Electrode In the embodiment and so on described above, the auxiliary connectors contain $WO_x$, the electron injection layer contains NaF, and the common electrode contains aluminum. However, this is not essential. The following describes modifications in terms of the materials.

2-1. Auxiliary Connectors

In the embodiment and so on described above, the auxiliary connectors contain $WO_x$. However, this is not essential. The material of the auxiliary connectors is not limited to $WO_x$, and the auxiliary connectors may contain any transition metal oxide. Examples of transition metal include Mo (molybdenum) and V (vanadium).

2-2. Electron Injection Layer

In the embodiment and so on described above, the electron injection layer contains NaF. However, this is not essential. The material of the electron injection layer is not limited to NaF, and the electron injection layer may contain any alkali metal fluoride or alkaline-earth metal fluoride. Alternatively, the electron injection layer may contain a combination of different fluorides selected from among alkali metal fluorides and alkaline-earth metal fluorides. Note that examples of alkali metal include Na, Li (lithium) and Cs (cesium), and examples of alkaline-earth metal include Ca (calcium), Ba (barium) and Mg (magnesium). Also, the material of the electron injection layer is not limited to fluorides, and the electron injection layer may contain simple alkali metals or simple alkaline-earth metals.

2-3. Common Electrode

In the embodiment and so on described above, the common electrode contains Al. However, this is not essential. The material of the common electrode may be any reductive metal such as Cu, Ag, or Mg.

3 Examples of Application of Organic EL Element

An organic EL element pertaining to an aspect of the present invention is applicable to an organic EL panel, an organic EL light-emitting apparatus, and an organic EL display apparatus. Application of the organic EL element to an organic EL panel, an organic EL light-emitting apparatus, and an organic EL display apparatus allows for reduction of uneven luminance in these apparatuses, and realizes apparatuses with excellent luminescence properties.

As for the organic EL panel, a single organic EL element, a plurality of organic EL elements corresponding to red, green and blue pixels, or a plurality of organic elements of a same single color may be arranged in the organic EL panel. An organic EL light-emitting apparatus can, for example, be used in an illumination apparatus. An organic EL display apparatus can, for example, be used in an organic EL display.

INDUSTRIAL APPLICABILITY

An organic EL element according to an aspect of the present invention may be favorably used in the home, in public facilities, and in the workplace in an organic EL apparatus used in various display apparatuses, televisions, displays for portable electronic devices, and the like.

LIST OF REFERENCE SIGNS

1: organic EL display panel
3: drive circuit
5: control circuit
100: Substrate
101: TFT layer
102: interlayer insulation layer
103: planarizing layer
104: pixel electrode
105: hole injection layer
106: hole transport layer
107: light-emitting layer
108: electron injection layer
109: common electrode
110: auxiliary connector
111: partition layer
112: TFT substrate

The invention claimed is:

1. An organic EL element including: a substrate; and a pixel region and an auxiliary region formed adjacent to each other on the substrate, comprising:
    a pixel electrode formed on a section of the substrate corresponding to the pixel region;
    an auxiliary connector formed on a section of the substrate corresponding to the auxiliary region;
    a first functional layer formed to cover the pixel electrode and the auxiliary connector;
    a light-emitting layer containing organic light-emitting material and formed on a section of the first functional layer corresponding to the pixel region;
    a second functional layer formed to cover the light-emitting layer and formed on a section of the first functional layer corresponding to the auxiliary region; and
    a common electrode formed to seamlessly cover a section of the second functional layer corresponding to the pixel region and a section of the second functional layer corresponding to the auxiliary region, wherein
    the first functional layer consists of an oxide compound of a transition metal,
    the second functional layer contains a fluoride compound of at least one of an alkali metal and an alkaline-earth metal,
    the common electrode contains a metal that causes reduction of the fluoride compound contained in the second functional layer,
    a maximum thickness of the section of the second functional layer corresponding to the auxiliary region is equal to or smaller than a maximum peak-to-valley height Rmax in a roughness profile of a surface of the section of the first functional layer corresponding to the auxiliary region, and
    the section of the second functional layer corresponding to the auxiliary region consists of portions of the second functional layer corresponding to the auxiliary region, wherein the portions of the second functional layer corresponding to the auxiliary region are in valleys of the surface of the section of the first functional layer corresponding to the auxiliary region with peaks of the surface of the section of the first functional layer corresponding to the auxiliary region being in direct contact with the common electrode.

2. The organic EL element of claim 1, wherein
an XPS spectrum of the section of the first functional layer corresponding to the auxiliary region exhibits a greater upward protrusion than an XPS spectrum of the section of the first functional layer corresponding to the pixel region within a range between a lowest binding energy level corresponding to respective peaks of the XPS spectra and a binding energy level that is 3.6 eV lower than the lowest binding energy level.

3. The organic EL element of claim 1, wherein
an average oxidation number of the transition metal contained in the section of the first functional layer corresponding to the auxiliary region is smaller than an average oxidation number of the transition metal contained in the section of the first functional layer corresponding to the pixel region.

4. The organic EL element of claim 1, wherein
the transition metal is W, Mo, or V.

5. The organic EL element of claim 1, wherein
the fluoride compound contained in the second functional layer is NaF, $BaF_2$, $CaF_2$, CsF, or $MgF_2$.

6. The organic EL element of claim 1, wherein
the metal that causes the reduction is Al, Cu, Ag, or Mg.

7. An organic EL panel having the organic EL element according to claim 1 provided in a plurality.

8. An organic EL light-emitting apparatus having the organic EL element according to claim 1 and a drive circuit for driving the organic EL element.

9. An organic EL display apparatus having the organic EL element according to claim 1 and a drive circuit for driving the organic EL element.

10. The organic EL element of claim 1, wherein the first functional layer is formed by a sputtering method.

11. The organic EL element of claim 1, wherein the transition metal is tungsten.

12. The organic EL element of claim 1, wherein
the first functional layer has a thickness of 1 nm to 50 nm, and
the portions of the second functional layer corresponding to the auxiliary region and in the valleys of the surface of the section of the first functional layer corresponding to the auxiliary region have a thickness of 0.1 nm to 1 nm.

13. The organic EL element of claim 1, wherein portions of the common electrode corresponding to the auxiliary region are in the valleys of the surface of the section of the first functional layer corresponding to the auxiliary region.

14. The organic EL element of claim 1, wherein a surface of a section of the common electrode corresponding to the auxiliary region is in contact with the peaks of the surface of the section of the first function layer corresponding to the auxiliary region, and in contact with the portions of the second functional layer corresponding to the auxiliary region which are in the valleys of the surface of the section of the first functional layer corresponding to the auxiliary region.

15. The organic EL element of claim 1, wherein a surface of a section of the common electrode corresponding to the auxiliary region and in contact with the peaks of the surface of the section of the first function layer corresponding to the auxiliary region is not planar.

* * * * *